(12) United States Patent
Niu et al.

(10) Patent No.: US 10,396,019 B2
(45) Date of Patent: Aug. 27, 2019

(54) MOLDED INTELLIGENT POWER MODULE AND METHOD OF MAKING THE SAME

(71) Applicant: Alpha and Omega Semiconductor (Cayman) Ltd., Grand Cayman (KY)

(72) Inventors: Zhiqiang Niu, Santa Clara, CA (US); Bum-Seok Suh, Seongnam (KR); Wonjin Cho, Suwon-si (KR); Jun Lu, San Jose, CA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 0 days.

(21) Appl. No.: 16/170,895

(22) Filed: Oct. 25, 2018

(65) Prior Publication Data

US 2019/0067175 A1 Feb. 28, 2019

Related U.S. Application Data

(60) Division of application No. 15/699,985, filed on Sep. 8, 2017, now Pat. No. 10,141,249, which is a
(Continued)

(51) Int. Cl.
*H01L 23/495* (2006.01)
*H02P 27/00* (2006.01)
(Continued)

(52) U.S. Cl.
CPC ........ *H01L 23/49575* (2013.01); *H01L 21/56* (2013.01); *H01L 23/16* (2013.01);
(Continued)

(58) Field of Classification Search
CPC ....... H01L 2924/00; H01L 2924/00014; H01L 2224/73265; H01L 2924/00012; H01L 2224/48247; H01L 2224/32225; H01L 2224/48465; H01L 2924/181; H01L 2924/0002; H01L 2224/45099; H01L 2924/15311; H01L 2224/49171; H01L 2924/14; H01L 2224/49175; H01L 2224/48472; H01L 2924/1305; H01L 2924/01029; H01L 2924/30107;
(Continued)

(56) References Cited

U.S. PATENT DOCUMENTS 7,952,317 B2 * 5/2011 Suh .......................... H02P 27/08
318/801

* cited by examiner

*Primary Examiner* — Robert G Bachner
(74) *Attorney, Agent, or Firm* — Chen-Chi Lin

(57) ABSTRACT

An intelligent power module (IPM) has a first, second, third and fourth die paddles, a first, second, third, fourth, fifth and sixth metal-oxide-semiconductor field-effect transistors (MOSFETs), a tie bar, a metal slug, a plurality of spacers, a plurality of leads and a molding encapsulation. The molding encapsulation encloses the first, second, third and fourth die paddles, the first, second, third, fourth, fifth and sixth MOSFETs, the tie bar and the plurality of spacers. A bottom surface of the metal slug is exposed from the molding encapsulation. A process for fabricating the IPM comprises preparing the first, second, third and fourth die paddles, the first, second, third, fourth, fifth and sixth MOSFETs, the tie bar, the plurality of leads, the metal slug and the plurality of spacers and applying a molding process to form the molding encapsulation.

6 Claims, 8 Drawing Sheets

Related U.S. Application Data continuation-in-part of application No. 15/600,698, filed on May 19, 2017, now Pat. No. 9,881,856, which is a continuation of application No. 15/294,766, filed on Oct. 16, 2016, now Pat. No. 9,704,789, said application No. 15/699,985 is a continuation-in-part of application No. 15/602,002, filed on May 22, 2017, now Pat. No. 10,177,080, which is a continuation-in-part of application No. 15/294,766, filed on Oct. 16, 2016, now Pat. No. 9,704,789.

(51) Int. Cl.
  *H01L 27/06* (2006.01)
  *H01L 23/31* (2006.01)
  *H01L 23/16* (2006.01)
  *H01L 21/56* (2006.01)
  H01L 23/00 (2006.01)

(52) U.S. Cl.
  CPC ...... *H01L 23/3107* (2013.01); *H01L 23/3114* (2013.01); *H01L 23/4952* (2013.01); *H01L 23/49537* (2013.01); *H01L 23/49555* (2013.01); *H01L 23/49562* (2013.01); *H01L 27/0629* (2013.01); *H02P 27/00* (2013.01); H01L 24/45 (2013.01); H01L 24/48 (2013.01); H01L 24/49 (2013.01); H01L 2224/0603 (2013.01); H01L 2224/45144 (2013.01); H01L 2224/45147 (2013.01); H01L 2224/48137 (2013.01); H01L 2224/48139 (2013.01); H01L 2224/48247 (2013.01); H01L 2224/48465 (2013.01); H01L 2224/49111 (2013.01); H01L 2224/49171 (2013.01); H01L 2224/49175 (2013.01); H01L 2924/13091 (2013.01); H01L 2924/14 (2013.01); H01L 2924/181 (2013.01)

(58) Field of Classification Search
  CPC ..... H01L 2924/45144; H01L 2924/014; H01L 2224/05599; H01L 2224/45015; H01L 2924/13091; H01L 2924/1306; H01L 2924/01033; H01L 2224/32245; H01L 2224/49111; H01L 2924/01082; H01L 2924/01047; H01L 2924/19041; H01L 2924/19107; H01L 2924/01074; H01L 2224/0401; H01L 2224/48095; H02M 7/003; H02M 7/537; H05K 7/20927; H05K 7/1432; H05K 7/2089; H05K 1/0262; H05K 1/0263; H05K 1/144; H05K 2201/2009; H05K 13/00; H05K 1/0222; H05K 1/023; H05K 1/0231; H05K 1/0251; H05K 1/0271; H05K 1/0306; H05K 1/09; H05K 1/113; H05K 1/115; H05K 1/141; H05K 1/145; H05K 1/162; H05K 1/18; H05K 1/181; H05K 1/183; H05K 1/185; H05K 2201/0175; H05K 2201/0355; H05K 2201/068; H05K 2201/09036; H05K 2201/09136; H05K 2201/09518; H05K 2201/096; H05K 2201/09636; H05K 2201/09718; H05K 2201/10159; H05K 2201/10166; H05K 2201/10409; H05K 2201/10242; H05K 2201/1031; H05K 2201/10424; H05K 2201/10522; H05K 2201/1059; H05K 2201/10659; H05K 2201/10962; H05K 2201/2018; H05K 2203/0152; H05K 2203/0405; H05K 2203/1178; H05K 3/0052; H05K 3/0061; H05K 3/202; H05K 3/284; H05K 3/305; H05K 3/325; H05K 3/3421; H05K 3/3452; H05K 3/368; H05K 3/38; H05K 3/4015; H05K 3/429; H05K 3/4644; H05K 3/4652; H05K 5/0247; H05K 7/1412; H05K 7/20845; H01F 27/2804; H01F 2027/2809; G06F 1/26; G06F 17/5045; G06F 17/5054; G06F 17/5068; G06F 17/5077; G06F 1/3203; G06F 1/324; G06F 2217/12; G06F 2217/62; H01G 4/40; H01G 4/232; H01G 4/30; H01G 4/33; B23K 1/0008; B23K 2201/40; B23K 3/0623; B81C 1/0023; F28F 3/12; G01L 19/0076; G01L 9/0044; G06K 19/072; G06K 19/077; G06K 19/07769; H01R 13/2421; Y02P 70/611; Y02P 70/613; Y02P 90/265; Y10T 29/41; Y10T 29/49082; Y10T 29/49169; Y10T 307/50
  See application file for complete search history.

MOLDED INTELLIGENT POWER MODULE AND METHOD OF MAKING THE SAME

CROSS-REFERENCE TO RELATED APPLICATIONS

This Patent Application is a Divisional Application of a pending patent application Ser. No. 15/699,985 filed on Sep. 8, 2017. Patent application Ser. No. 15/699,985 is a Continuation-in-part application of a pending patent application Ser. No. 15/600,698 filed on May 19, 2017 and issued as a U.S. Pat. No. 9,881,856 on Jan. 30, 2018. Patent application Ser. No. 15/600,698 is a Continuation of a patent application Ser. No. 15/294,766 filed on Oct. 16, 2016 and issued as U.S. Pat. No. 9,704,789 on Jul. 11, 2017. Patent application Ser. No. 15/699,985 is a Continuation-in-part application of a pending patent application Ser. No. 15/602,002 filed on May 22, 2017. Patent application Ser. No. 15/602,002 is a Continuation-in-part application of the patent application Ser. No. 15/294,766 filed on Oct. 16, 2016 and issued as U.S. Pat. No. 9,704,789 on Jul. 11, 2017. The disclosure made in the patent application Ser. No. 15/699,985, the disclosure made in the patent application Ser. No. 15/294,766, the disclosure made in patent application Ser. No. 15/600,698 and the disclosure made in patent application Ser. No. 15/602,002 are hereby incorporated by reference.

FIELD OF THE INVENTION

This invention relates generally to a molded intelligent power module (IPM) for driving a motor and a method of making the IPM. More particularly, the present invention relates to a molded IPM having a metal slug to facilitate heat dissipation.

BACKGROUND OF THE INVENTION

A conventional IPM for driving a motor has three driving integrated circuits (ICs). In the patent application Ser. No. 15/294,766, an IPM has a low voltage IC and a high voltage IC. In the patent application Ser. No. 15/602,002, an IPM has a single IC directly attached to a tie bar. It is desired to further reduce the operational temperature of the IPM.

In the present disclosure, the IPM includes a metal slug to facilitate heat dissipation. A thickness of a plurality of spacers define a vertical gap between bottom surfaces of a plurality of die paddles and a top surface of the metal slug. In one example, a thermal resistance (RthJC) reduces by 40% by adding the metal slug. The die size also increases from 6.2 mm×6.2 mm to 10.0 mm×10.0 mm. The power rating is increased accordingly.

SUMMARY OF THE INVENTION

The present invention discloses an IPM having a first, second, third and fourth die paddles, a first, second, third, fourth, fifth and sixth metal-oxide-semiconductor field-effect transistors (MOSFETs), a tie bar, a metal slug, a plurality of spacers, a plurality of leads and a molding encapsulation. The first MOSFET is attached to the first die paddle. The second MOSFET is attached to the second die paddle. The third MOSFET is attached to the third die paddle. The fourth, fifth and sixth MOSFETs are attached to the fourth die paddle. The molding encapsulation encloses the first, second, third and fourth die paddles, the first, second, third, fourth, fifth and sixth MOSFETs, the tie bar and the plurality of spacers. A bottom surface of the metal slug is exposed from the molding encapsulation.

A process for fabricating the IPM is disclosed. A plurality of die paddles, a plurality of transistors, a tie bar, a plurality of leads, a metal slug and a plurality of spacers are prepared. A molding process to form a molding encapsulation is applied.

DETAILED DESCRIPTION OF THE INVENTION

Figure 1:
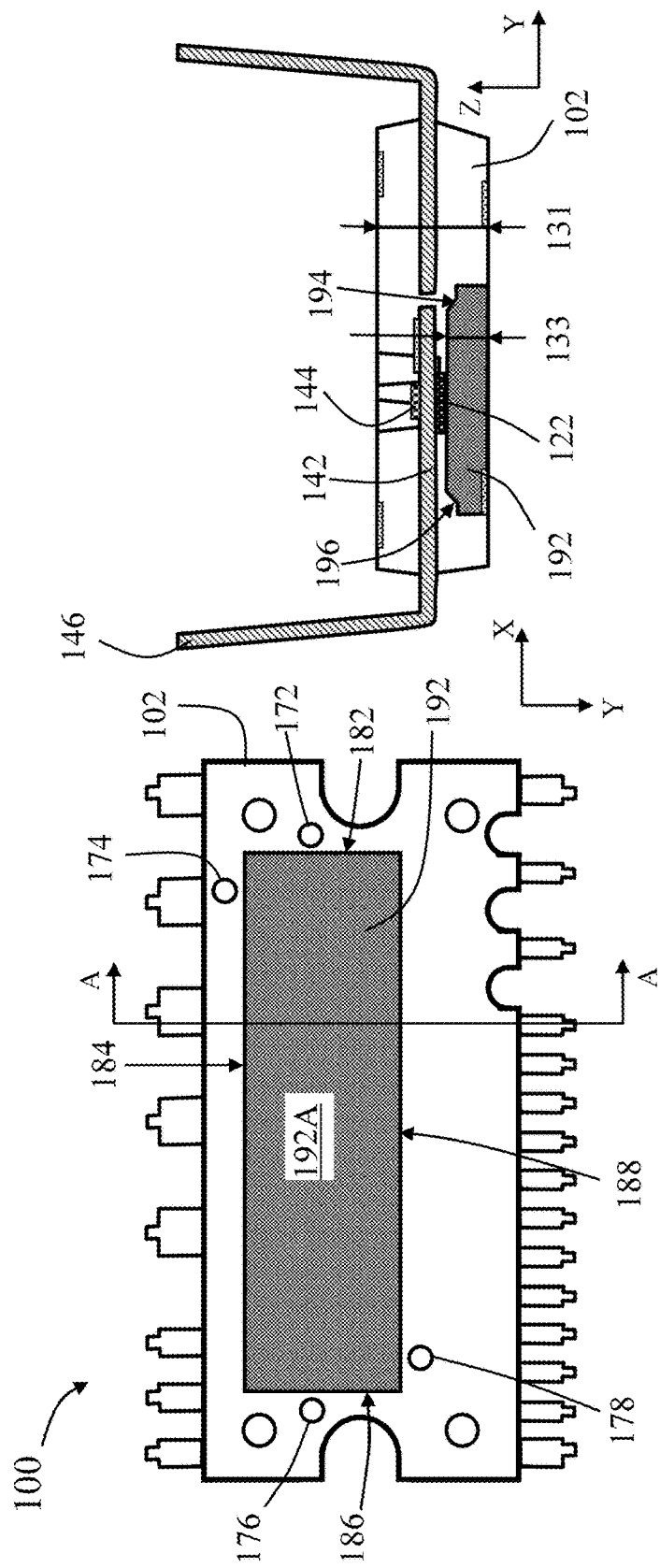
FIG. 1A is a bottom view and FIG. 1B is a cross-sectional view perpendicular to AA plane of an intelligent power module (IPM) for driving a motor in examples of the present disclosure.

FIG. 1A is a bottom view and FIG. 1B is a cross-sectional view perpendicular to AA plane of an intelligent power module (IPM) 100 for driving a motor in examples of the present disclosure. The IPM 100 comprises a leadframe that includes a plurality of die paddles 142 surrounded by a plurality of leads 146, a plurality of transistors 144 mounted on a first side of the die paddles 142, a metal slug 192, a plurality of spacers 122 disposed on a second side opposite the first side of the die paddles 142, and a molding encapsulation 102. In Z-direction, the plurality of spacers 122 are disposed between the metal slug 192 and the plurality of die paddles 142. The molding encapsulation 102 encloses the plurality of die paddles 142, the plurality of transistors 144 and the plurality of spacers 122. The plurality of leads 146 are partially embedded in the molding encapsulation 102. As shown, portions of the plurality of leads 146 embedded in the molding encapsulation 102 are coplanar to the plurality of die paddles 142. A majority portion of the metal slug 192 is embedded in the molding encapsulation 102. A bottom surface 192A of the metal slug 192 is exposed from the molding encapsulation 102 to facilitate heat dissipation.

In examples of the present disclosure, the metal slug 192 serves as a heat sink. In examples of the present disclosure, to facilitate heat dissipation, a thickness 133 of the metal slug 192 is larger than one third of a thickness 131 of the molding encapsulation 102. In examples of the present disclosure, the thickness 133 of the metal slug 192 is 1.3 millimeters and the thickness 131 of the molding encapsulation 102 is 3.6 millimeters.

In examples of the present disclosure, the IPM 100 further comprises a first location pin 172, a second location pin 174, a third location pin 176 and a fourth location pin 178. In examples of the present disclosure, the metal slug 192 is of a rectangular prism shape. The metal slug 192 has a first chamfered recess 194 along a longitudinal direction (X-axis)

and a second chamfered recess 196 parallel to the first chamfered recess 194. The first chamfered recess 194 and the second chamfered recess 196 are located at upper edges of the metal slug 192 respectively. The first location pin 172 is disposed adjacent to a first side 182 of the metal slug 192. The second location pin 174 is disposed adjacent to a second side 184 of the metal slug 192. The third location pin 176 is disposed adjacent to a third side 186 of the metal slug 192. The fourth location pin 178 is disposed adjacent to a fourth side 188 of the metal slug 192. The first location pin 172, the second location pin 174, the third location pin 176 and the fourth location pin 178 are used to define the in-plane (XY plane) position of the metal slug 192. In one example, the language "adjacent to" refers to a distance less than 0.1 millimeter.

In examples of the present disclosure, the plurality of transistors 144 are metal-oxide-semiconductor field-effect transistors (MOSFETs). The plurality of transistors 144 are directly attached to top surfaces of the plurality of die paddles 142.

Figure 2:
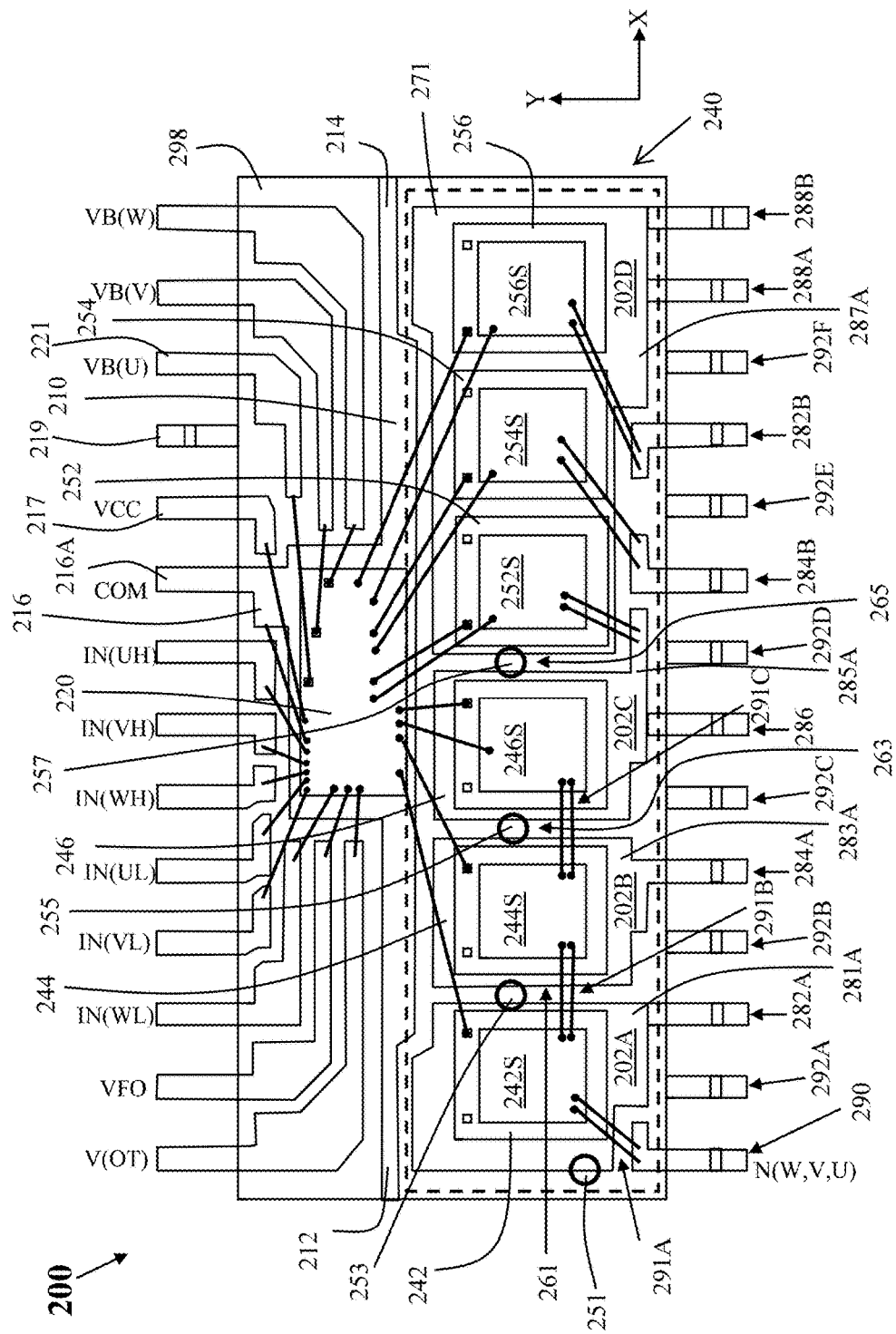
FIG. 2 is a top view of another IPM in examples of the present disclosure.

FIG. 2 is a top view of an IPM 200 in examples of the present disclosure. The IPM 200 has a first die paddle 202A, a second die paddle 202B, a third die paddle 202C, a fourth die paddle 202D, a first transistor 242, a second transistor 244, a third transistor 246, a fourth transistor 252, a fifth transistor 254, a sixth transistor 256, a tie bar 210, an IC 220, a metal slug 271, a first spacer 251, a second spacer 253, a third spacer 255, a fourth spacer 257, a plurality of leads and a molding encapsulation 298.

In examples of the present disclosure, the IPM 200 includes four or more spacers. In examples of the present disclosure, the first spacer 251 is aligned with an edge of the first die paddle 202A. The second spacer 253 is aligned with a first gap 261 between the first die paddle 202A and the second die paddle 202B. The third spacer 255 is aligned with a second gap 263 between the second die paddle 202B and the third die paddle 202C. The fourth spacer 257 is aligned with a third gap 265 between the third die paddle 202C and the fourth die paddle 202D.

In examples of the present disclosure, the first spacer 251, the second spacer 253, the third spacer 255 and the fourth spacer 257 are made of plastics. In one example, the metal slug 271 is made of copper. In another example, the metal slug 271 is made of aluminum. In still another example, the metal slug 271 is made of steel. In yet another example, the metal slug 271 is made of nickel.

In examples of the present disclosure, the first spacer 251, the second spacer 253, the third spacer 255 and the fourth spacer 257 are of cylindrical shapes. A thickness of the first spacer 251, the second spacer 253, the third spacer 255 and the fourth spacer 257 is in a range from 0.2 millimeter to 0.6 millimeter. A vertical gap along Z-axis of FIG. 1B between bottom surfaces of the first die paddle 202A, the second die paddle 202B, the third die paddle 202C and the fourth die paddle 202D and a top surface of the metal slug 271 are filled with the molding encapsulation 298 and the first spacer 251, the second spacer 253, the third spacer 255 and the fourth spacer 257. The thickness of the first spacer 251, the second spacer 253, the third spacer 255 and the fourth spacer 257 defines the vertical gap along Z-axis of FIG. 1B between the bottom surfaces of the first die paddle 202A, the second die paddle 202B, the third die paddle 202C and the fourth die paddle 202D and the top surface of the metal slug 271. In examples of the present disclosure, a thermal conductivity of the molding encapsulation 298 is in a range from 1.5 watts per meter-kelvin to 2.5 watts per meter-kelvin. A thermal conductivity of the first spacer 251, the second spacer 253, the third spacer 255 and the fourth spacer 257 is in a range from 0.4 watts per meter-kelvin to 0.8 watts per meter-kelvin. The thermal conductivity of the molding encapsulation 298 and the thermal conductivity of the first spacer 251, the second spacer 253, the third spacer 255 and the fourth spacer 257 are smaller than that of a metal. To facilitate heat dissipation, the thickness of the first spacer 251, the second spacer 253, the third spacer 255 and the fourth spacer 257 is preferred to be 0.6 millimeter or less. To provide insulation, the thickness of the first spacer 251, the second spacer 253, the third spacer 255 and the fourth spacer 257 is preferred to be 0.2 millimeter or more.

The first die paddle 202A, the second die paddle 202B, the third die paddle 202C, and the fourth die paddle 202D are separated from each other and arranged one by one next to each other in a sequence. In examples of the present disclosure, a portion of an upper side edge of the first die paddle 202A, an upper side edge of the second die paddle 202B, an upper side edge of the third die paddle 202C, and a portion of an upper side edge of the fourth die paddle 202D are co-planar. In one example, a middle section of a lower side edge of the tie bar 210 is along X-direction and is parallel to the upper side edges of the second die paddle 202B and the third die paddle 202C. In another example, a middle section of a lower side edge of the tie bar 210 is parallel to a portion of an upper side edge of the first die paddle 202A. In still another example, a middle section of a lower side edge of the tie bar 210 is parallel to a portion of an upper side edge of the fourth die paddle 202D. The first transistor 242 is attached to the first die paddle 202A. The second transistor 244 is attached to the second die paddle 202B. The third transistor 246 is attached to the third die paddle 202C. The fourth transistor 252, the fifth transistor 254 and the sixth transistor 256 are attached to the fourth die paddle 202D.

In examples of the present disclosure, the tie bar 210 extends along the upper edges of the die paddles 202A, 202B, 202C and 202D. A first end 212 of the tie bar 210 extends beyond an outer edge of the first die paddle 202A. A second end 214 of the tie bar 210 extends beyond an outer edge of the fourth die paddle 202D. In examples of the present disclosure, the tie bar 210 further includes a mid-range extension 216 between the first end 212 and the second end 214. The mid-range extension 216 of the tie bar 210 is mechanically and electrically connected to a ground lead 216A. The mid-range extension 216 extends along a lateral direction (Y-direction) perpendicular to the upper edge of the third die paddle 202C. In examples of the present disclosure, a power lead 217 is between the ground lead 216A and an isolation lead 219. One end of the isolation lead 219 terminates in the molding encapsulation 298. The isolation lead 219 is between the power lead 217 and a lead 221. By having the isolation lead 219, the distance between the power lead 217 and the lead 221 is increased. It increases electrical current capability. The IC 220 is attached to an expansion area of the tie bar 210 between the first end 212 and the second end 214. In examples of the present disclosure, the IC 220 is electrically connected to the first transistor 242, the second transistor 244, the third transistor 246, the fourth transistor 252, the fifth transistor 254 and the sixth transistor 256 by bonding wires. In examples of the present disclosure, the bonding wires are preferably gold bonding wires.

In examples of the present disclosure, the molding encapsulation 298 encloses the first die paddle 202A, the second die paddle 202B, the third die paddle 202C, the fourth die paddle 202D, the first transistor 242, the second transistor 244, the third transistor 246, the fourth transistor 252, the fifth transistor 254, the sixth transistor 256, the tie bar 210, the metal slug 271, the first spacer 251, the second spacer 253, the third spacer 255 and the fourth spacer 257 and the IC 220. In examples of the present disclosure, the plurality of leads are partially embedded in the molding encapsulation 298. In examples of the present disclosure, end surfaces of the first end 212 and the second end 214 of the tie bar 210 are exposed from edge surfaces of the molding encapsulation 298.

In examples of the present disclosure, the IPM 200 has leads 290, 292A, 282A, 292B, 284A, 292C, 286, 292D, 284B, 292E, 282B, 292F, 288A and 288B. In examples of the present disclosure, leads 282A, 284A, 286, 288A and 288B are high-voltage leads. A first connecting member 281A connects the first die paddle 202A to a first lead 282A. A second connecting member 283A connects the second die paddle 202B to a second lead 284A. A third connecting member 285A connects the third die paddle 202C to a third lead 286. A fourth connecting member 287A connects the fourth die paddle 202D to a fourth lead 288A.

In examples of the present disclosure, lead 290 is a low-voltage lead. Leads 282A, 282B, 284A, 284B, 286, 288A and 288B are high-voltage leads. In examples of the present disclosure, in an application, the high-voltage leads 282A and 282B may be shorted together. The high-voltage leads 284A and 284B may be shorted together.

In examples of the present disclosure, a first isolation lead 292A is between a first low-voltage lead 290 and the first lead 282A. A second isolation lead 292B is between the first lead 282A and a second lead 284A. A third isolation lead 292C is between the second lead 284A and a third lead 286. A fourth isolation lead 292E is between a first selected high-voltage lead 284B and a second selected high-voltage lead 282B. A fifth isolation lead 292F is between the second selected high-voltage lead 282B and a fourth lead 288A. The first lead 282A is connected to the second selected high-voltage lead 282B through a printed circuit board (not shown) and the second lead 284A is connected to the first selected high-voltage lead 284B through the printed circuit board. By connecting through the printed circuit board, it provides more space for the IC 220. Therefore, a size of the IC 220 may be increased.

In examples of the present disclosure, the IC 220 is directly attached to the tie bar 210. In examples of the present disclosure, the IPM 200 does not have another IC directly attached to the tie bar 210 (only the IC 220 is directly attached to the tie bar 210). The first, second, third, fourth, fifth and sixth transistors are metal-oxide-semiconductor field-effect transistors (MOSFETs). A first bonding wire 291A connects a source 242S of the first transistor 242 to the first low-voltage lead 290. A second bonding wire 291B connects the source 242S of the first transistor 242 to a source 244S of the second transistor 244. A third bonding wire 291C connects the source 244S of the second transistor 244 to a source 246S of the third transistor 246. In examples of the present disclosure, the first, second and third bonding wires are copper bonding wires.

Figure 3:
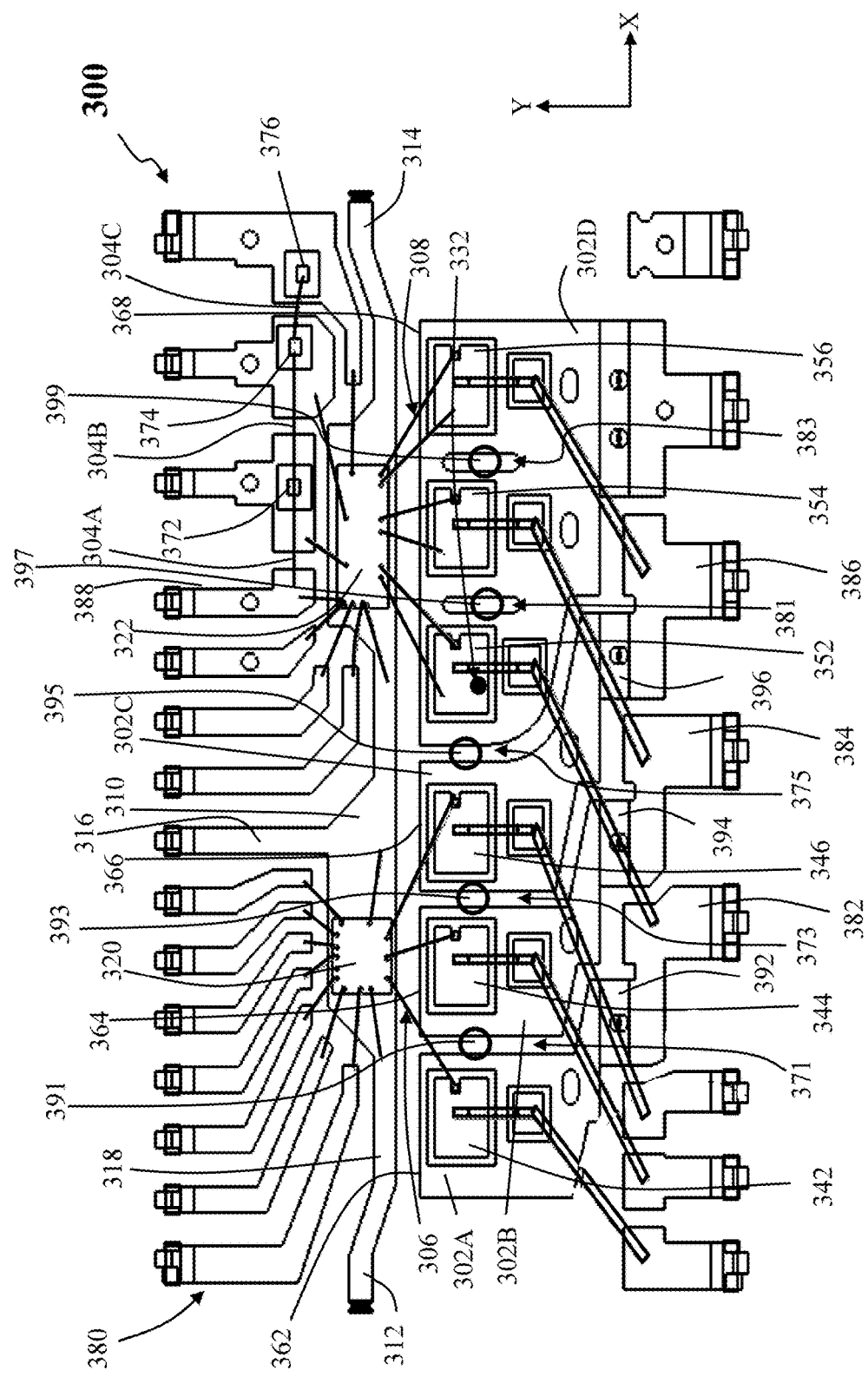
FIG. 3 is a top view of still another IPM (with a metal slug and a molding encapsulation not shown) in examples of the present disclosure.

FIG. 3 is a top view of an IPM 300 (with a metal slug 192 of FIG. 1A and a molding encapsulation 102 of FIG. 1A not shown) in examples of the present disclosure. The IPM 300 has a first die paddle 302A, a second die paddle 302B, a third die paddle 302C, a fourth die paddle 302D, a first transistor 342, a second transistor 344, a third transistor 346, a fourth transistor 352, a fifth transistor 354, a sixth transistor 356, a tie bar 310, a low voltage IC 320, a high voltage IC 322, a first boost diode 372, a second boost diode 374, a third boost diode 376, a first spacer 391, a second spacer 393, a third spacer 395, a fourth spacer 397, a fifth spacer 399, and a plurality of leads 380.

In examples of the present disclosure, the first spacer 391 is aligned with a first gap 371 between the first die paddle 302A and the second die paddle 302B. The second spacer 393 is aligned with a second gap 373 between the second die paddle 302B and the third die paddle 302C. The third spacer 395 is aligned with a third gap 375 between the third die paddle 302C and the fourth die paddle 302D. The fourth spacer 397 is aligned with a first slot 381 of the fourth die paddle 302D. The fifth spacer 399 is aligned with a second slot 383 of the fourth die paddle 302D.

The first die paddle 302A, the second die paddle 302B, the third die paddle 302C, and the fourth die paddle 302D are separated from each other and arranged one by one next each other in sequence with one edge of each die paddle aligned substantially in a line. The first transistor 342 is attached to the first die paddle 302A. The second transistor 344 is attached to the second die paddle 302B. The third transistor 346 is attached to the third die paddle 302C. The fourth transistor 352, the fifth transistor 354 and the sixth transistor 356 are attached to the fourth die paddle 302D.

The tie bar 310 extends along the aligned edges of the die paddles. A first end 312 of the tie bar 310 extends beyond an outer edge of the first die paddle 302A. A second end 314 of the tie bar 310 extends beyond an outer edge of the fourth die paddle 302D. In examples of the present disclosure, the tie bar 310 further includes a mid-range extension 316 between the first end 312 and the second end 314. The mid-range extension 316 of the tie bar 310 is mechanically and electrically connected to a ground pin. The mid-range extension 316 extends along a lateral direction (Y-direction) perpendicular to aligned edges of the die paddles. The low voltage IC 320 is attached to a first expansion area of the tie bar 310 between the first end 312 and the mid-range extension 316 adjacent the second die paddle 302B. In examples of the present disclosure, the low voltage IC 320 is electrically connected to the first transistor 342, the second transistor 344 and the third transistor 346 by bonding wires 306. The high voltage IC 322 is attached to a second expansion area of the tie bar 310 between the second end 314 and the mid-range extension 316 adjacent the fourth die paddle 302D. In examples of the present disclosure, the high voltage IC 322 is electrically connected to the fourth transistor 352, the fifth transistor 354 and the sixth transistor 356 by bonding wires 308.

In examples of the present disclosure, the molding encapsulation 102 of FIG. 1A encloses the first die paddle 302A, the second die paddle 302B, the third die paddle 302C, the fourth die paddle 302D, the first transistor 342, the second transistor 344, the third transistor 346, the fourth transistor 352, the fifth transistor 354, the sixth transistor 356, the tie bar 310, the low voltage IC 320, the high voltage IC 322, the first boost diode 372, the second boost diode 374, the third boost diode 376, the first spacer 391, the second spacer 393, the third spacer 395, the fourth spacer 397 and the fifth spacer 399. In examples of the present disclosure, the plurality of leads 380 are partially embedded in the molding encapsulation 102 of FIG. 1A. In examples of the present disclosure, end surfaces of the first end 312 and the second end 314 of the tie bar 310 are exposed from edge surfaces of the molding encapsulation 102 of FIG. 1A. In examples of the present disclosure, a majority portion of the metal slug 192 of FIG. 1A is embedded in the molding encapsulation 102 of FIG. 1A. A bottom surface of the metal slug 192 of FIG. 1A is exposed from the molding encapsulation 102 of FIG. 1A.

In examples of the present disclosure, upper side edges 362, 364, 366 and 368 of the first die paddle 302A, the second die paddle 302B, the third die paddle 302C and the fourth die paddle 302D are aligned. A middle section 318 of a lower side edge of the tie bar 310 is parallel to the upper side edges 362, 364, 366 and 368.

In examples of the present disclosure, a first bonding wire 304A connects the first boost diode 372 to an adjacent lead 388 of the plurality of leads 380. A second bonding wire 304B connects the second boost diode 374 to the first boost diode 372. A third bonding wire 304C connects the third boost diode 376 to the second boost diode 374. In examples of the present disclosure, the adjacent lead 388 of the plurality of leads 380 is a power supply (Vcc) pin.

A first connecting member 392 connects the first die paddle 302A to a first lead 382 of the plurality of leads 380. A second connecting member 394 connects the second die paddle 302B to a second lead 384 of the plurality of leads 380. A third connecting member 396 connects the third die paddle 302C to a third lead 386 of the plurality of leads 380. The first connecting member 392, the second connecting member 394 and the third connecting member 396 have a same width. In examples of the present disclosure, the same width is at least 1.2 millimeters. A width of a conventional connecting member is in the range from 0.7 millimeters to 0.8 millimeters. A wider connecting member provides stronger mechanical support, increases electrical current capability by reducing resistance, and increases heat dissipation.

Figure 4:
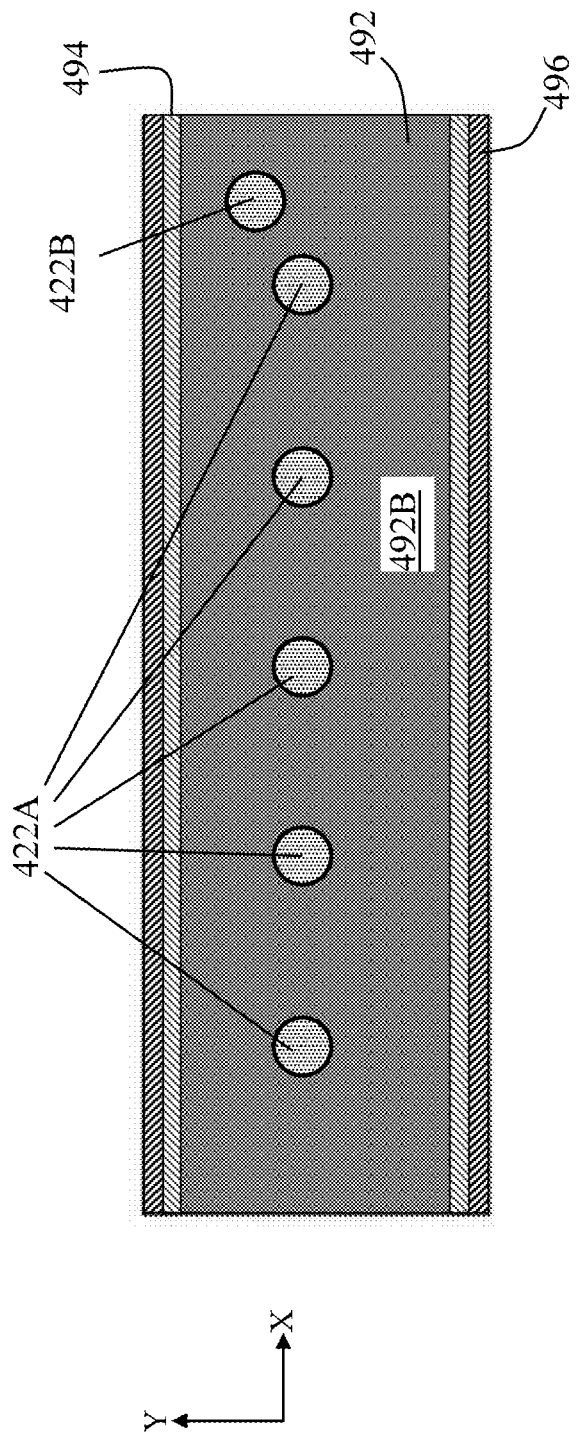
FIG. 4 is a top view of a metal slug and a plurality of spacers in examples of the present disclosure.

FIG. 4 is a top view of a metal slug 492 and a first plurality of spacers 422A and a second plurality of spacers 422B in examples of the present disclosure. The metal slug 492 has a first chamfered recess 494 along a longitudinal direction (X-axis) and a second chamfered recess 496 parallel to the first chamfered recess 494. The first chamfered recess 494 and the second chamfered recess 496 reduce turbulence of a molding blow during a molding process. In examples of the present disclosure, the first plurality of spacers 422A and the second plurality of spacers 422B are pre-formed on a top surface 492B of the metal slug 492. In examples of the present disclosure, the first plurality of spacers 422A are aligned along the longitudinal direction (X-axis) to reduce turbulence of the molding blow during the molding process.

Figure 5:
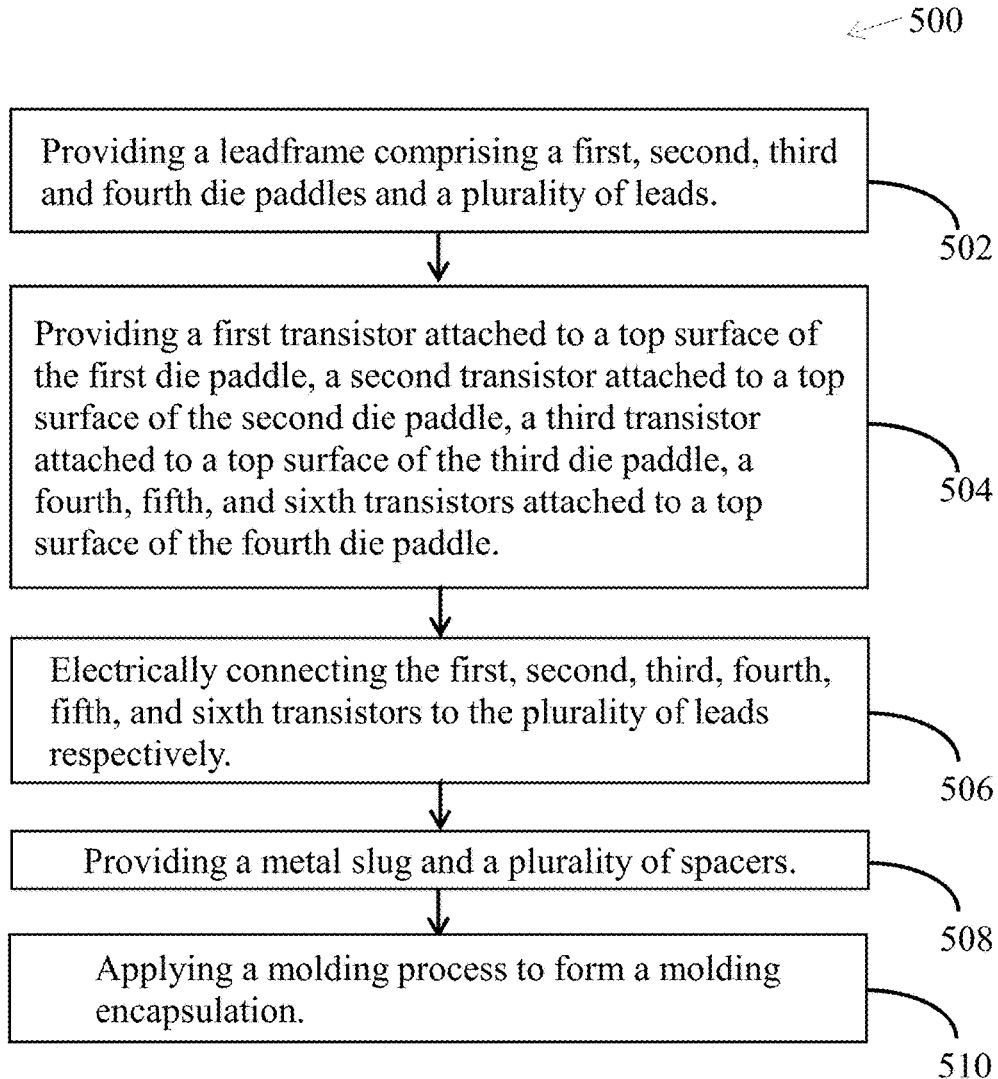
FIG. 5 is a flowchart of a process to fabricate yet another IPM in examples of the present disclosure.
Figure 7:
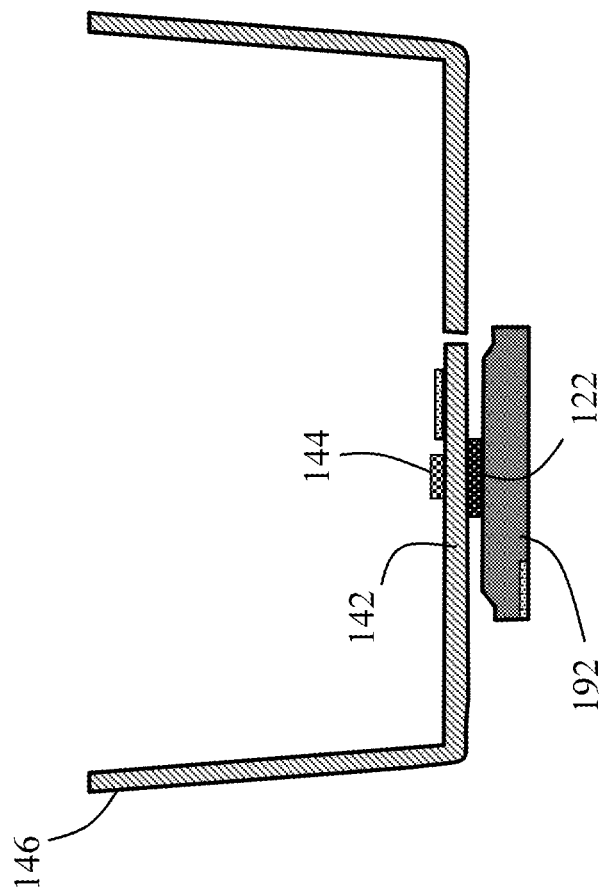
FIG. 7 and FIG. 8 are a series of side views showing various processing steps to fabricate an IPM in examples of the present disclosure.

FIG. 5 is a flowchart of a process 500 to fabricate an IPM for driving a motor in examples of the present disclosure. A plurality of die paddles 142 of FIG. 7, a plurality of transistors 144 of FIG. 7, a tie bar 210 of FIG. 2, a plurality of leads 146 of FIG. 7, a metal slug 192 of FIG. 7 and a plurality of spacers 122 of FIG. 7 are prepared. The process 500 may begin in block 502.

In block 502, a leadframe 240 of FIG. 2 comprising a first die paddle 202A, a second die paddle 202B, a third die paddle 202C and a fourth die paddle 202D (for example, a plurality of die paddles 142 of FIG. 7) and a plurality of leads (for example, a plurality of leads 146 of FIG. 7) are prepared. Block 502 may be followed by block 504. Block 502 may be followed by block 504.

In block 504, the first transistor 242 is attached to a top surface of the first die paddle 202A. The second transistor 244 is attached to a top surface of the second die paddle 202B. The third transistor 246 is attached to a top surface of the third die paddle 202C. The fourth transistor 252, the fifth transistor 254 and the sixth transistor 256 are attached to a top surface of the fourth die paddle 202D (see FIG. 2). Block 504 may be followed by block 506.

In block 506, the first, second, third, fourth, fifth, and sixth transistors (for example, a plurality of transistors 144 of FIG. 7) are electrically connected to the plurality of leads (for example, the plurality of leads 146 of FIG. 7) respectively.

In examples of the present disclosure, block 506 further comprises a sub-step of applying a plurality of wire bonding processes to connect the IC 220 of FIG. 2 to the first, second, third, fourth, fifth, and sixth transistors (242, 244, 246, 252, 254 and 256 of FIG. 2) and a portion of the plurality of leads (for example, 216A, 217 and 221 of FIG. 2).

In examples of the present disclosure, block 506 further comprises a sub-step of applying a first plurality of wire bonding processes to connect the low voltage IC 320 of FIG. 3 to the first, second and third transistors (342, 344 and 346 of FIG. 3) and a first portion of the plurality of leads 380 of FIG. 3. Block 502 still further comprises a sub-step of applying a second plurality of wire bonding processes to connect a high voltage IC 322 of FIG. 3 to the fourth, fifth, and sixth transistors (352, 354 and 356 of FIG. 3) and a second portion of the plurality of leads 380 of FIG. 3. Block 506 may be followed by block 508.

In block 508, a metal slug 192 of FIG. 7 and a plurality of spacers 122 of FIG. 7 are provided. The plurality of spacers 122 are between the metal slug 192 and the first, second, third and fourth die paddles (for example, a plurality of die paddles 142 of FIG. 7). The plurality of spacers 122 separate the metal slug 192 from contacting the first, second, third, and fourth die paddles (for example, a plurality of die paddles 142 of FIG. 7).

In examples of the present disclosure, block 508 further comprises sub-steps of forming a first, second, third and fourth location pins (172, 174, 176 and 178 of FIG. 1A) and placing the metal slug 192 in a location so that the first location pin 172 is disposed adjacent to a first side 182 of the metal slug 192; the second location pin 174 is disposed adjacent to a second side 184 of the metal slug 192; the third location pin 176 is disposed adjacent to a third side 186 of the metal slug 192; and the fourth location pin 178 is disposed adjacent to a fourth side 188 of the metal slug 192.

Figure 6:
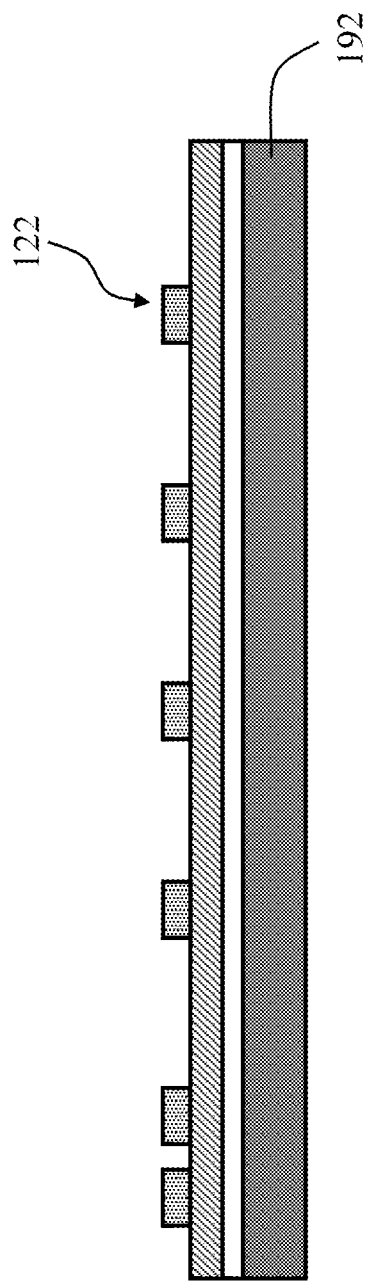
FIG. 6 is a side view of a metal slug and a plurality of spacers in examples of the present disclosure.

In examples of the present disclosure, block 508 further comprises a sub-step of printing and curing the plurality of spacers 122 of FIG. 6 on the metal slug 192 of FIG. 6. Therefore, bottom surfaces of the plurality of spacers 122 of FIG. 6 directly contact a top surface of the metal slug 192 of FIG. 6. Block 508 still further comprises a sub-step of placing the plurality of die paddles 142 of FIG. 7 on top of the plurality of spacers 122 of FIG. 7. Therefore, bottom surfaces of the plurality of die paddles 142 of FIG. 7 directly contact top surfaces of the plurality of spacers 122 of FIG. 6. Block 508 may be followed by block 510.

Figure 8:
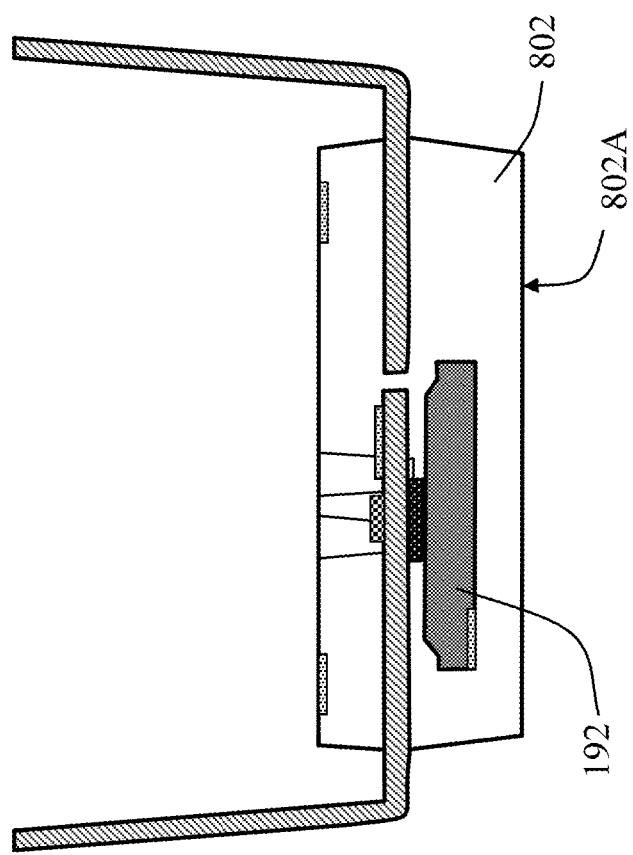

In block 510, a molding process to form a molding encapsulation is applied. In one example, a bottom surface of the applied molding encapsulation 102 of FIG. 1B is flush with a bottom surface of the metal slug 192 of FIG. 1B. In another example, a bottom surface 802A of the applied molding encapsulation 802 of FIG. 8 is located lower than a bottom surface of the metal slug 192 of FIG. 8. It is followed with the step of grinding the bottom surface 802A of the molding encapsulation 802 so that the bottom surface of the metal slug 192 is exposed from the molding encapsulation.

Those of ordinary skill in the art may recognize that modifications of the embodiments disclosed herein are possible. For example, a shape of the spacers may vary. Other modifications may occur to those of ordinary skill in this art, and all such modifications are deemed to fall within the purview of the present invention, as defined by the claims.

The invention claimed is:

1. A method for fabricating an intelligent power module (IPM) for driving a motor, the method comprising the steps of:
   providing a leadframe comprising a first, second, third and fourth die paddles and a plurality of leads;
   providing a first transistor attached to a top surface of the first die paddle, a second transistor attached to a top surface of the second die paddle, a third transistor attached to a top surface of the third die paddle, a fourth, fifth, and sixth transistors attached to a top surface of the fourth die paddle;
   electrically connecting the first, second, third, fourth, fifth, and sixth transistors to the plurality of leads respectively;
   providing a metal slug and a plurality of spacers; wherein the plurality of spacers are between the metal slug and the first, second, third and fourth die paddles; and wherein the plurality of spacers separate the metal slug from contacting the first, second, third, and fourth die paddles; and
   applying a molding process to form a molding encapsulation enclosing the first, second, third, and fourth die paddles, the first, second, third, fourth, fifth, and sixth transistors and the plurality of spacers.

2. The method of claim 1, before the step of applying the molding process to form the molding encapsulation,
   forming a first, second, third and fourth location pins;
   placing the metal slug in a location so that
      the first location pin is disposed adjacent to a first side of the metal slug;
      the second location pin is disposed adjacent to a second side of the metal slug;
      the third location pin is disposed adjacent to a third side of the metal slug; and
      the fourth location pin is disposed adjacent to a fourth side of the metal slug.

3. The method of claim 1, before the step of providing the metal slug and the plurality of spacers,
   applying a plurality of wire bonding processes to connect an integrated circuit (IC) to the first, second, third, fourth, fifth, and sixth transistors and a portion of the plurality of leads.

4. The method of claim 1, before the step of providing the metal slug and the plurality of spacers,
   applying a first plurality of wire bonding processes to connect a low voltage integrated circuit (IC) to the first, second and third transistors and a first portion of the plurality of leads; and
   applying a second plurality of wire bonding processes to connect a high voltage IC to the fourth, fifth, and sixth transistors and a second portion of the plurality of leads.

5. The method of claim 1, wherein the step of providing the metal slug and the plurality of spacers comprises the sub-steps of
   printing and curing the plurality of spacers on the metal slug so that bottom surfaces of the plurality of spacers directly contact a top surface of the metal slug; and
   placing the first, second, third and fourth die paddles on top of the plurality of spacers so that bottom surfaces of the first, second, third and fourth die paddles directly contact top surfaces of the plurality of spacers.

6. The method of claim 1, after the step of applying the molding process to form the molding encapsulation,
   grinding a bottom surface of the molding encapsulation so that the bottom surface of the metal slug is exposed from the molding encapsulation.

* * * * *